(12) United States Patent
Yamazaki et al.

(10) Patent No.: US 10,481,492 B2
(45) Date of Patent: Nov. 19, 2019

(54) IMPRINT APPARATUS AND METHOD OF MANUFACTURING ARTICLE

(71) Applicant: CANON KABUSHIKI KAISHA, Tokyo (JP)

(72) Inventors: Takuro Yamazaki, Inagi (JP); Tomomi Funayoshi, Utsunomiya (JP); Masayoshi Fujimoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 197 days.

(21) Appl. No.: 15/423,714

(22) Filed: Feb. 3, 2017

(65) Prior Publication Data

US 2017/0235220 A1 Aug. 17, 2017

(30) Foreign Application Priority Data

Feb. 12, 2016 (JP) ................................ 2016-025201

(51) Int. Cl.
| | |
|---|---|
| *G03F 7/00* | (2006.01) |
| *B05D 3/12* | (2006.01) |
| *B29C 43/18* | (2006.01) |
| *B29C 43/34* | (2006.01) |
| *B29C 43/58* | (2006.01) |
| *H01L 21/027* | (2006.01) |

(52) U.S. Cl.
CPC ............. *G03F 7/0002* (2013.01); *B05D 3/12* (2013.01); *B29C 43/18* (2013.01); *B29C 43/34* (2013.01); *B29C 43/58* (2013.01); *H01L 21/0271* (2013.01); *B29C 2043/3433* (2013.01); *B29C 2043/585* (2013.01); *B29C 2043/5883* (2013.01)

(58) Field of Classification Search
None
See application file for complete search history.

(56) References Cited

U.S. PATENT DOCUMENTS

| 8,679,357 B2 | 3/2014 | Wakamatsu et al. | |
|---|---|---|---|
| 2013/0120485 A1* | 5/2013 | Kodama | G03F 7/0002 347/14 |
| 2018/0361672 A1* | 12/2018 | Ochi | B29C 64/112 |

FOREIGN PATENT DOCUMENTS

JP 5337776 B2 11/2013

* cited by examiner

*Primary Examiner* — Timothy Kennedy
(74) *Attorney, Agent, or Firm* — Rossi, Kimms & McDowell LLP

(57) ABSTRACT

The present invention provides an imprint apparatus including a supply device including discharge ports which discharge a imprint material, and configured to supply the imprint material onto a substrate via the discharge ports, and a controller configured to cause, if there is a defective discharge port of the discharge ports, the supply device to discharge the imprint material from another discharge port, different from the defective discharge port, of the discharge ports, wherein a mold for the molding includes a line pattern, and the controller is configured to control the supply device such that an interval between supply positions of the imprint material do not become larger in a direction orthogonal to a direction along the line pattern than that before change from the defective discharge port to the other discharge port.

17 Claims, 10 Drawing Sheets

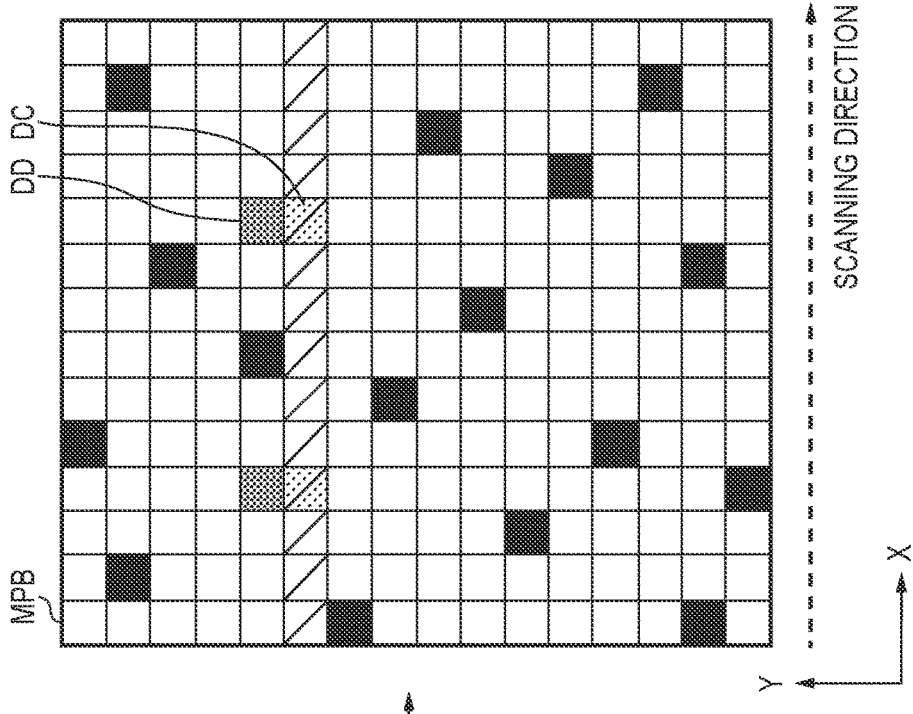
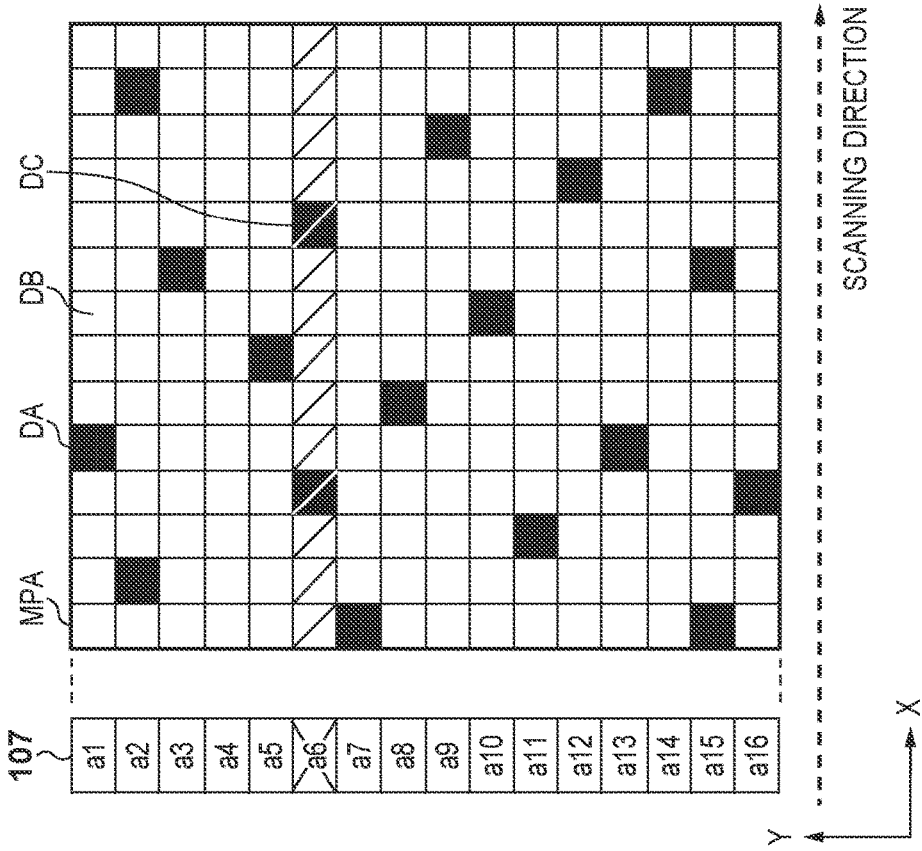

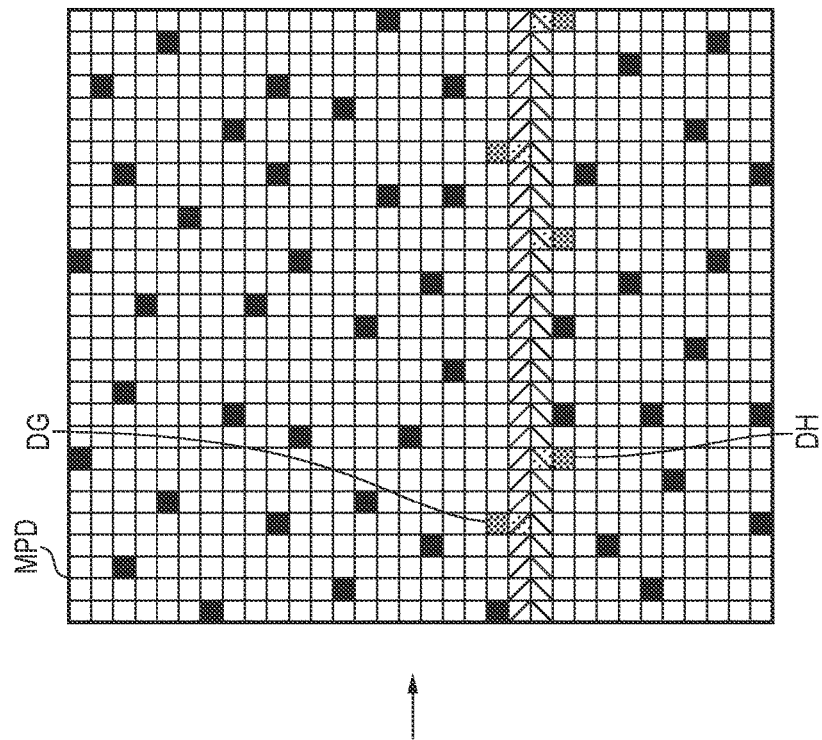
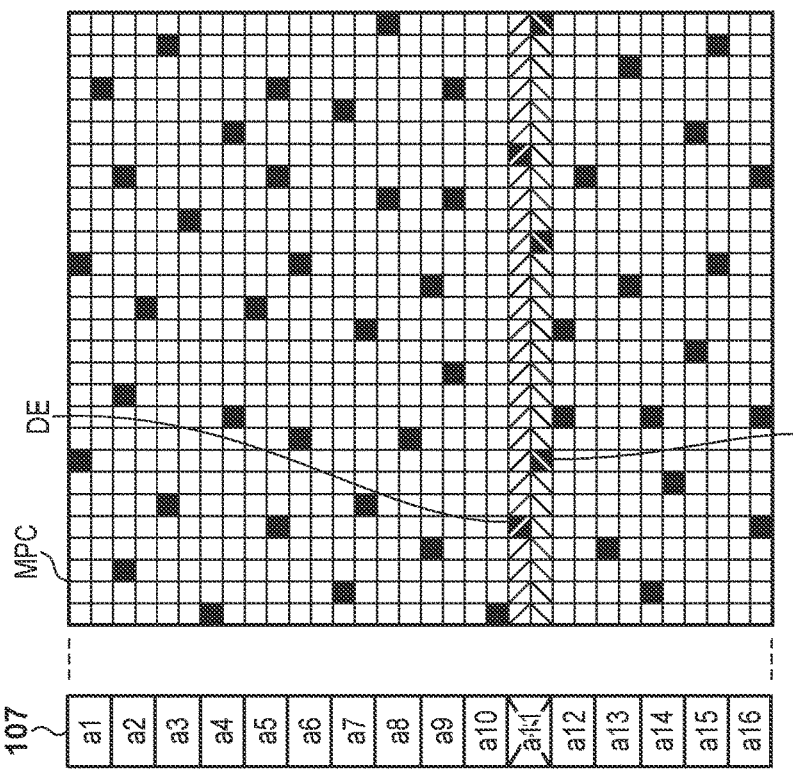

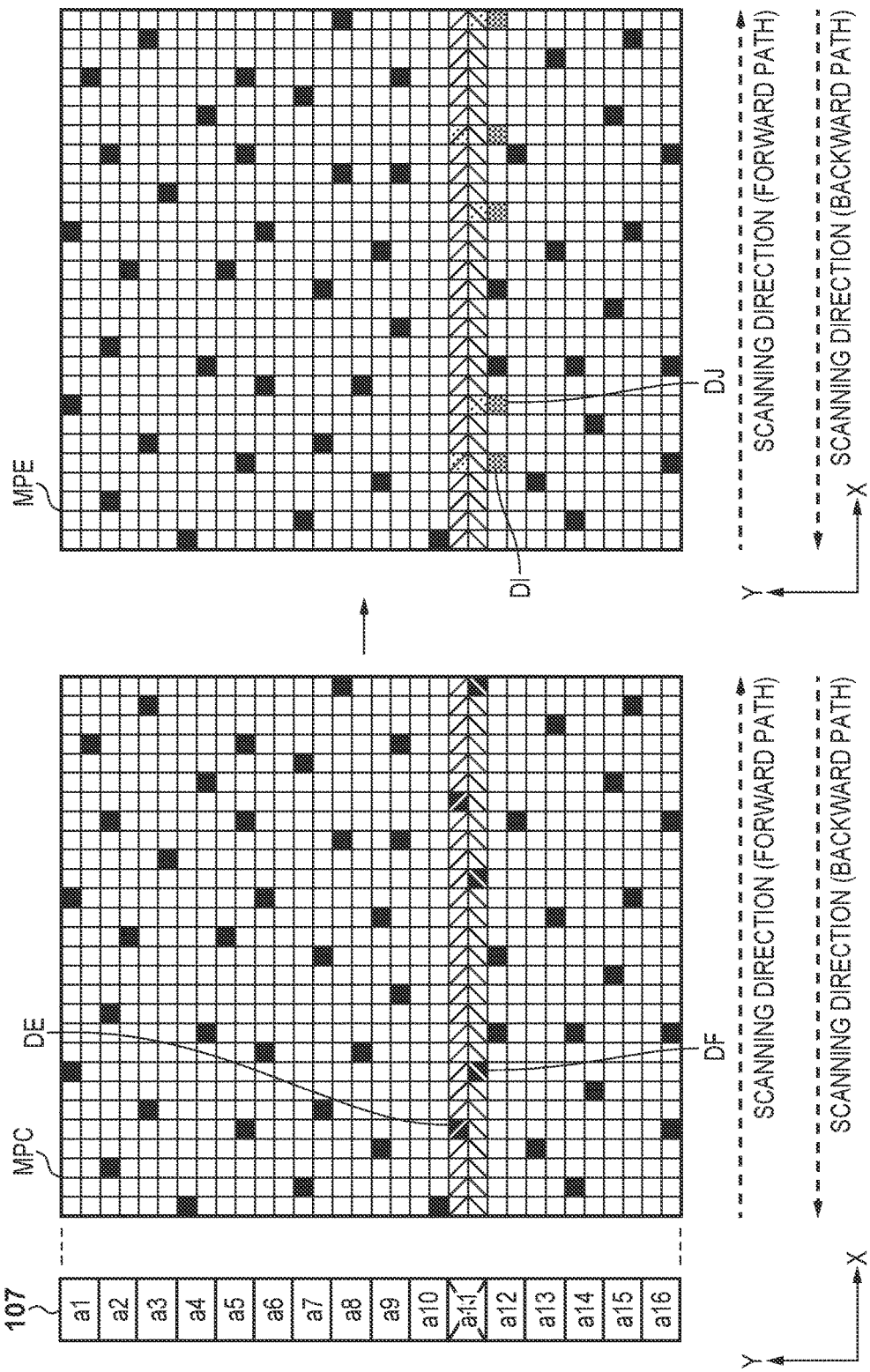

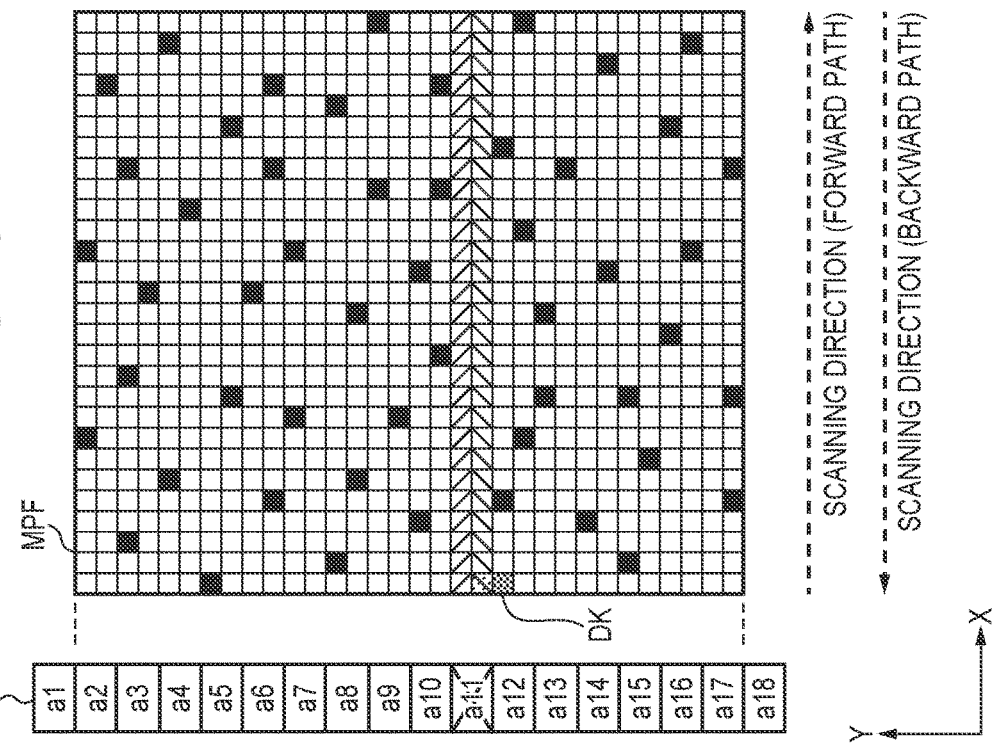
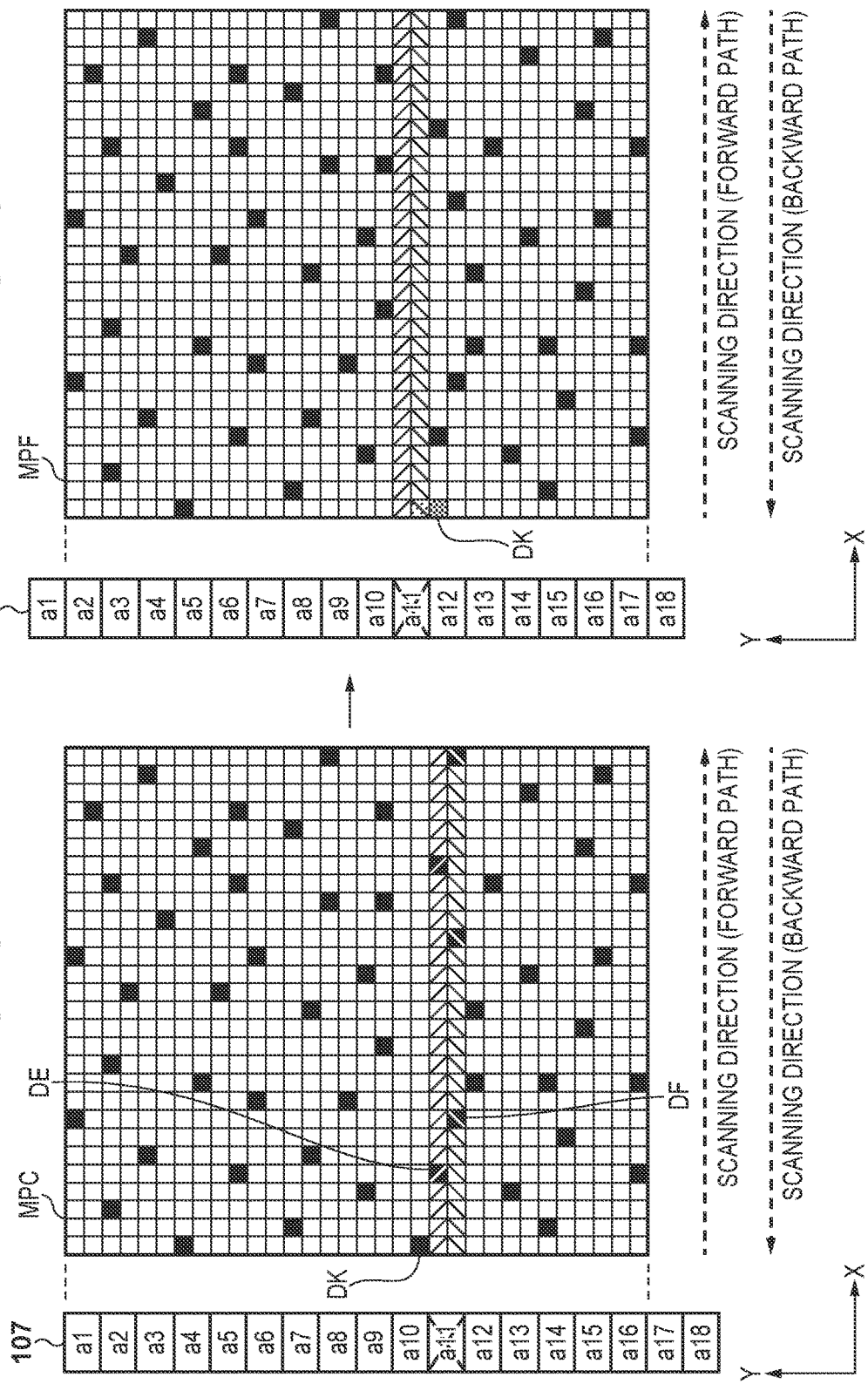

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

An imprint technique is a technique capable of transferring a nanoscale micropattern, and has received attention as one of nanolithography techniques for mass-producing semiconductor devices and magnetic storage media. An imprint apparatus using the imprint technique supplies an imprint material onto a substrate based on a map (also called an imprint recipe or drop recipe) indicating the supply positions of the imprint material on the substrate. The imprint apparatus then cures the imprint material in a state in which a pattern-formed mold is in contact with the imprint material supplied onto the substrate, and separates the mold from the cured imprint material, thereby forming a pattern on the substrate.

The imprint apparatus is required to reduce a defect (an unfilling defect, an abnormality of the residual layer thickness (RLT), or the like) of the pattern formed on the substrate. Although the imprint material is supplied onto the substrate from a supply unit such as a dispenser provided in the imprint apparatus, a discharge outlet for discharging the imprint material may clog. If no imprint material is discharged from a specific discharge outlet, part of the imprint material to be supplied onto the substrate lacks, and a defect of the pattern may occur at that position.

To solve this problem, Japanese Patent No. 5337776 proposes a technique of supplying droplets of an imprint material so that an intersecting angle defined by a main scanning direction in an inkjet method when discharging droplets of the imprint material and the line direction of the pattern of a mold falls within a range of 30° to 90°.

In the technique disclosed in Japanese Patent No. 5337776, however, the influence of a discharge outlet which cannot discharge the imprint material is reduced but the reduction of a defect in a pattern formed on a substrate is insufficient.

SUMMARY OF THE INVENTION

The present invention provides, for example, an imprint apparatus advantageous in correct pattern formation.

According to one aspect of the present invention, there is provided an imprint apparatus which performs molding of an imprint material on a substrate to form a pattern on the substrate, the apparatus including a supply device including discharge ports which discharge the imprint material, and configured to supply the imprint material onto the substrate via the discharge ports, and a controller configured to cause, if there is a defective discharge port of the discharge ports, the supply device to discharge the imprint material from another discharge port, different from the defective discharge port, of the discharge ports, wherein a mold for the molding includes a line pattern, and the controller is configured to control the supply device such that an interval between supply positions of the imprint material do not become larger in a direction orthogonal to a direction along the line pattern than that before change from the defective discharge port to the other discharge port.

Further features of the present invention will become apparent from the following description of exemplary embodiments with reference to the attached drawings.

BRIEF DESCRIPTION OF THE DRAWINGS

FIGS. 6A and 6B are views each showing the relationship between a map and the plurality of discharge outlets of the discharge unit of the imprint apparatus shown in FIG. 1.

FIGS. 7A and 7B are views each showing the relationship between a map and the plurality of discharge outlets of the discharge unit of the imprint apparatus shown in FIG. 1.

FIGS. 8A and 8B are views each showing the relationship between a map and the plurality of discharge outlets of the discharge unit of the imprint apparatus shown in FIG. 1.

FIGS. 9A and 9B are views each showing the relationship between a map and the plurality of discharge outlets of the discharge unit of the imprint apparatus shown in FIG. 1.

DESCRIPTION OF THE EMBODIMENTS

Figure 1:
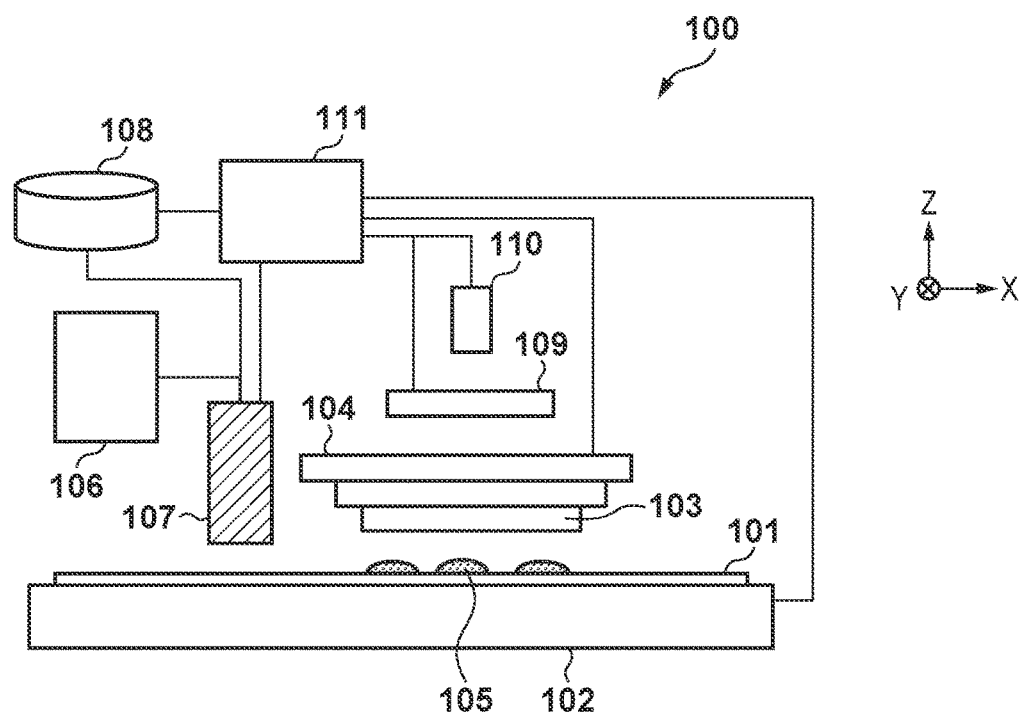
FIG. 1 is a schematic view showing the arrangement of an imprint apparatus according to one aspect of the present invention.

Preferred embodiments of the present invention will be described below with reference to the accompanying drawings. Note that the same reference numerals denote the same members throughout the drawings, and a repetitive description thereof will not be given.

<First Embodiment>

FIG. 1 is a schematic view showing the arrangement of an imprint apparatus 100 according to one aspect of the present invention. The imprint apparatus 100 is a lithography apparatus used in a process of manufacturing a semiconductor device or the like. The imprint apparatus 100 performs an imprint process of forming a pattern by molding an imprint material on a substrate.

This embodiment assumes a photocuring resin material as an imprint material, and adopts a photocuring method of curing the imprint material by irradiation with light (ultraviolet light or the like). However, the present invention does not limit the imprint material to the resin material, and may use, for example, a photocuring material including a powder or particles of an inorganic material. In addition, the present invention does not limit the imprint material curing method to the photocuring method, and may adopt, for example, a heat-curing method of curing an imprint material by heat.

As shown in FIG. 1, the imprint apparatus 100 includes a stage 102 which holds a substrate 101, a head 104 which holds a mold 103, an accommodation unit 106, a discharge unit 107, a storage unit 108, an irradiation unit 109, an observation unit 110, and a control unit 111. A direction parallel to the optical axis of the irradiation unit 109 which irradiates the imprint material on the substrate with light is set as the Z-axis, and directions orthogonal to each other within a plane perpendicular to the Z-axis are set as the X- and Y-axes.

The substrate 101 is a substrate onto which the pattern of the mold 103 is transferred, and includes, for example, a single-crystal silicon substrate or SOI (Silicon on Insulator) substrate.

The stage 102 includes a substrate chuck which holds the substrate 101, and a driving mechanism for performing alignment between the mold 103 and the substrate 101. This driving mechanism includes, for example, a coarse motion driving system and a fine motion driving system, and drives (moves) the substrate 101 in the X-axis and Y-axis directions. In addition, the driving mechanism may have a function of driving the substrate 101 in the Z-axis direction and the θ direction (the rotational direction around the Z-axis) as well as in the X-axis and Y-axis directions and a tilt function of correcting the tilt of the substrate 101. In this embodiment, the stage 102 implements a function of changing the relative position between the substrate 101 and a plurality of discharge outlets (ports) in the discharge unit 107.

The mold 103 is a mold for molding, and has, on a surface facing the substrate 101, a pattern region in which a pattern to be transferred to an imprint material 105 supplied onto the substrate 101 has been formed. In this embodiment, the mold 103 includes a line pattern (line-shaped concave-convex pattern) in the pattern region. The mold 103 has, for example, a rectangular outer shape. The mold 103 is made of a material such as quartz which transmits light, ultraviolet light in this embodiment, for curing the imprint material 105 on the substrate.

The head 104 holds (fixes) the mold 103 by a vacuum chuck force or an electrostatic force. The head 104 includes a driving mechanism which drives (moves) the mold 103 in the Z-axis direction. The head 104 has a function of pressing the mold 103 against the uncured imprint material 105 supplied onto the substrate, and a function of separating the mold 103 from the cured imprint material 105 on the substrate.

The accommodation unit 106 includes a tank which accommodates (stores) the uncured imprint material 105. The accommodation unit 106 supplies the uncured imprint material 105 to the discharge unit 107 through a supply pipe. Note that the accommodation unit 106 may be structurally separated from the discharge unit 107 or integrated with the discharge unit 107.

The discharge unit (discharge unit) 107 is formed by, for example, a dispenser including a plurality of discharge outlets (nozzles) which discharge droplets of the imprint material 105 to the substrate 101, and functions as a supply unit of supplying (applying) the imprint material 105 onto the substrate. The unit of the supply amount of the imprint material 105 in the discharge unit 107 is "droplet", and the amount of one droplet of the imprint material 105 can range from sub-picoliter to several picoliters. Note that the discharge unit 107 need only supply the imprint material 105 of a predetermined amount for each unit region on the substrate, and it is not necessary to cause the imprint material 105 to come flying to the unit region as droplets.

In the array direction of the discharge outlets, positions (supply positions) on the substrate to which the discharge unit 107 can drop droplets of the imprint material 105 depend on the physical interval between the discharge outlets, and are determined in every several μm to several tens of μm. In the scanning direction (a direction orthogonal to the array direction of the discharge outlets) in which the substrate 101 is scanned with respect to the discharge outlets, positions on the substrate to which the discharge unit 107 can drop droplets of the imprint material 105 are determined based on the discharge period of the imprint material 105 and the speed of the stage 102.

An array of droplets of the imprint material 105 is formed on the substrate by supplying the imprint material 105 from the accommodation unit 106 to the discharge unit 107, and discharging droplets of the imprint material 105 from the discharge unit 107 while driving the stage 102 in the scanning direction.

The storage unit 108 stores an array of droplets of the imprint material 105 to be formed on the substrate, that is, a map (imprint recipe or drop recipe) indicating the supply positions of droplets of the imprint material 105. The map includes coordinate data about the supply positions of droplets of the imprint material 105 in a coordinate system defined on the substrate in association with the positions of the plurality of discharge outlets of the discharge unit 107 on the substrate, as will be described later. The map can also include discharge outlet number data for identifying discharge outlets used to discharge droplets of the imprint material 105. Note that the map may be in an image format, a text format, or a combination thereof.

The map is generated based on at least one of various kinds of information about the imprint apparatus 100 so as to suppress an abnormality of the residual layer thickness or a defect of a pattern of the imprint material 105 formed on the substrate. The various kinds of information about the imprint apparatus 100 include, for example, information about the substrate 101, that about the mold 103, that about the imprint material 105, that about the discharge unit 107, that about imprint conditions, and that about apparatus conditions. The information about the substrate 101 includes, for example, topography and wettability of the top surface layer of the substrate 101. The information about the mold 103 includes the layout, pitch, shape, and depth of the pattern of the mold 103 and the use history of the mold 103. The information about the imprint material 105 includes the viscosity, surface energy, and evaporation volume of the imprint material 105. The information about the discharge unit 107 includes the volume of one droplet of the imprint material 105 discharged from one discharge outlet, the interval between the discharge outlets, and the discharge period. The information about the imprint conditions includes the design value of the residual layer thickness of a pattern of the imprint material 105 to be formed on the substrate 101, and the filling time of the pattern of the mold 103 with the imprint material 105. The information about the apparatus conditions includes the speed of the stage 102, the illuminance of the irradiation unit 109, and gas flow conditions (the type of gas supplied to the imprint apparatus 100, a flow rate, and a direction).

The irradiation unit 109 has a function of curing the imprint material 105 on the substrate. The irradiation unit 109 includes, for example, a halogen lamp or LED, and irradiates the imprint material 105 on the substrate with ultraviolet light via the mold 103.

The observation unit 110 includes, for example, a camera, and observes the substrate 101 via the mold 103. More specifically, the observation unit 110 observes the state of the imprint material 105 discharged from the discharge unit 107 and supplied onto the substrate. The state of the imprint material 105 supplied onto the substrate includes the array of droplets of the imprint material 105 formed on the substrate and the spread of the imprint material 105 in a state in which the mold 103 is in contact with the imprint material 105 on the substrate. During a period from when the imprint material 105 is supplied from the discharge unit 107 onto the substrate until the mold 103 is separated from the cured imprint material 105 on the substrate, the observation unit 110 can observe the filling status of the imprint material 105 and the presence/absence of a foreign particle.

The control unit 111 includes a CPU and a memory, and controls the overall imprint apparatus 100 (the overall operation of the imprint apparatus 100). The control unit 111 controls the respective units of the imprint apparatus 100 to perform an imprint process. In addition, in this embodiment, the control unit 111 implements a function of updating the map stored in the storage unit 108, and a function of controlling (changing) the relative position between the substrate 101 and the plurality of discharge outlets of the discharge unit 107.

The imprint apparatus 100 supplies droplets of the imprint material 105 from the discharge unit 107 onto the substrate based on the map. The imprint apparatus 100 then cures the imprint material 105 in the state in which the mold 103 is in contact with the imprint material 105 on the substrate, and separates (releases) the mold 103 from the cured imprint material 105, thereby forming the pattern of the imprint material 105 on the substrate.

Figure 2:
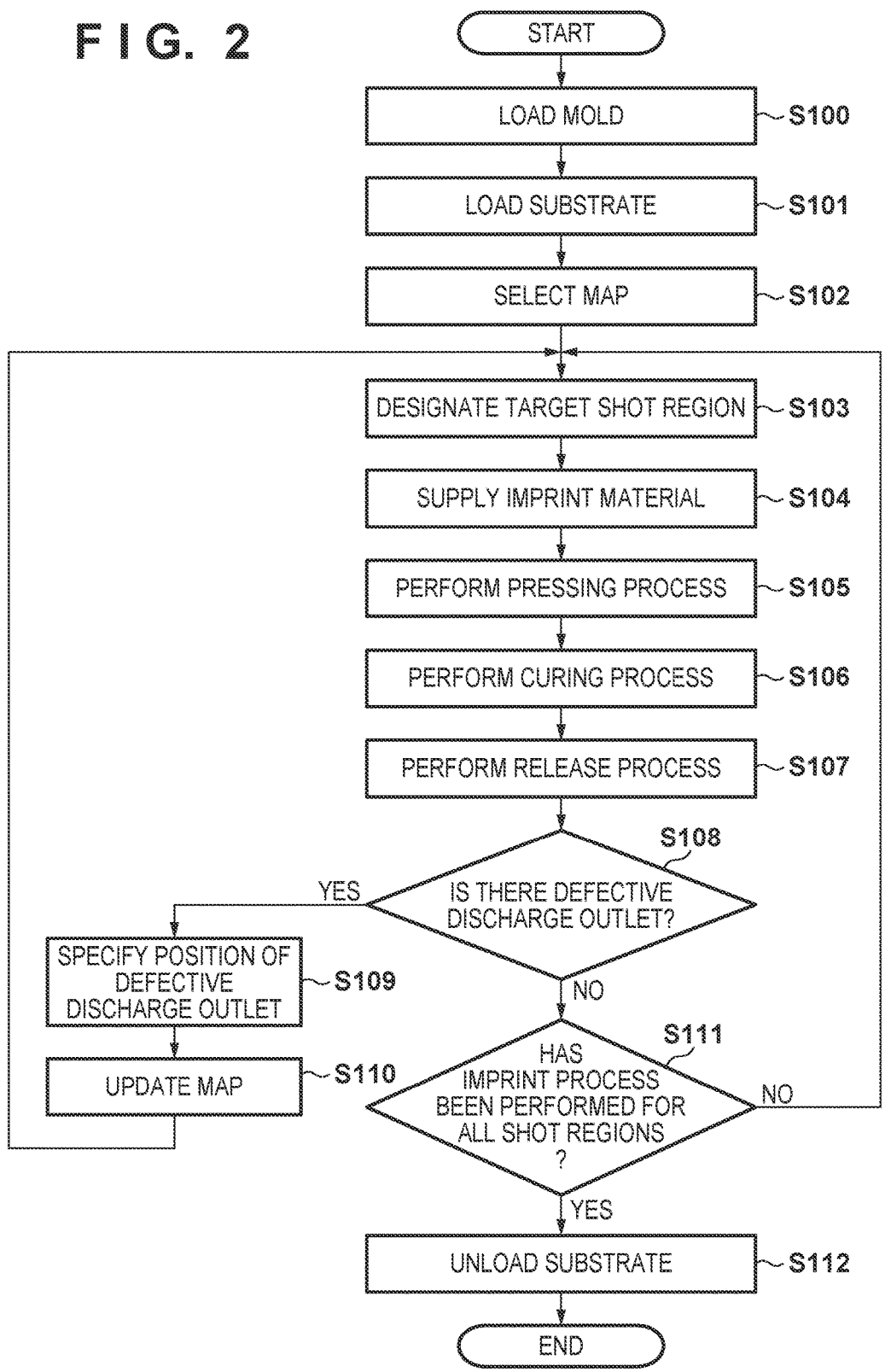
FIG. 2 is a flowchart for explaining an imprint process in the imprint apparatus shown in FIG. 1.

FIG. 2 is a flowchart for explaining the imprint process in the imprint apparatus 100. The imprint process is performed when the control unit 111 collectively controls the respective units of the imprint apparatus 100, as described above.

In step S100, the mold 103 which can form a pattern to be formed on the substrate 101 is loaded into the imprint apparatus 100 and is held by the head 104. The mold 103 is obtained by, for example, forming a concave-convex pattern corresponding to design information on a transparent quartz substrate used as a photomask.

In step S101, the substrate 101 is loaded into the imprint apparatus 100, and is held by the stage 102.

In step S102, one map to be used for the imprint process is selected from a plurality of maps stored in the storage unit 108. For example, a map is selected based on at least one of the information about the mold 103, that about the substrate 101, that about the imprint material 105, that about the discharge unit 107, that about the imprint conditions, and that about the apparatus conditions. This map is optimized so as to perform the imprint process free from a defect or an abnormality of the residual layer thickness for a target filling time, and to obtain necessary characteristics within a shortest time. It is most preferable to supply the imprint material 105 to supply positions on the substrate indicated by the map selected in step S102.

Figure 3:
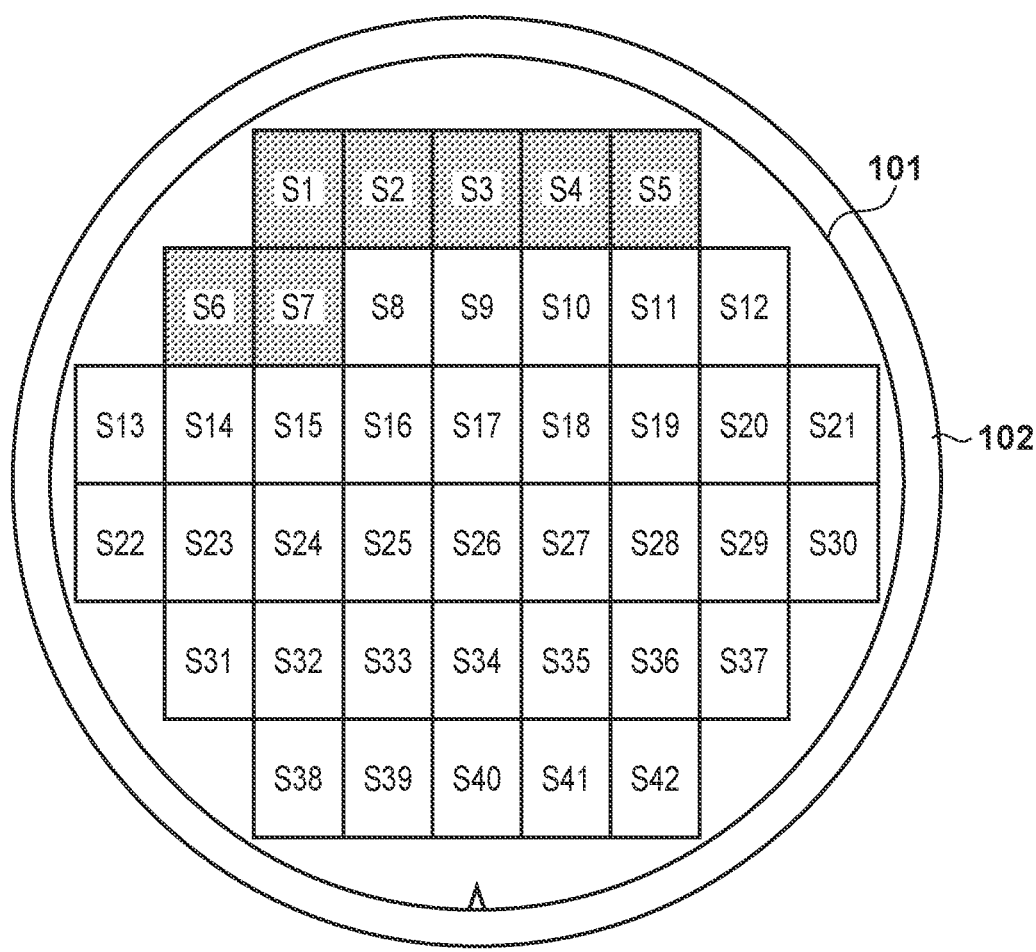
FIG. 3 is a view showing an example of an array of shot regions on a substrate.

In step S103, a shot region not having undergone the imprint process among shot regions on the substrate shown in FIG. 3 is designated as a target shot region. Assume that the shot region is a region where a pattern is formed by one imprint process. In this embodiment, for example, the imprint process is performed in an order of successive shot regions S1, S2, S3, . . . , S41, and S42 on the substrate 101, as shown in FIG. 3. Note that the order of the imprint process is not limited to one as shown in FIG. 3, and may be a staggered pattern order or random.

Figure 4A:
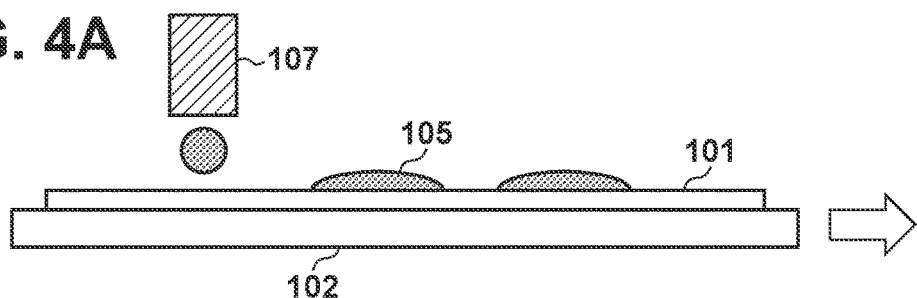
FIGS. 4A to 4E are views for explaining the imprint process.

In step S104, the imprint material 105 is supplied from the discharge unit 107 onto the substrate. At this time, as shown in FIG. 4A, the discharge unit 107 sequentially discharges droplets of the imprint material 105 onto the substrate along with movement of the stage 102 in accordance with the map selected in step S102.

Figure 4B:
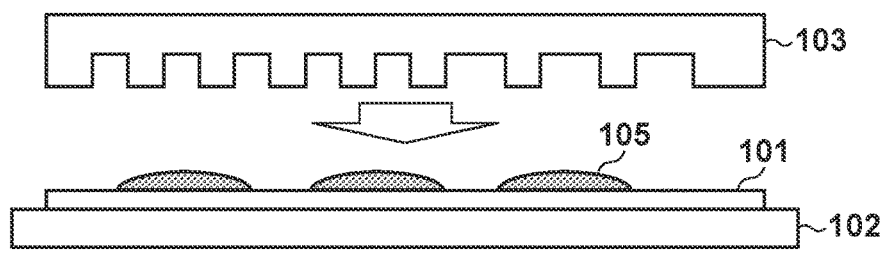
Figure 4C:
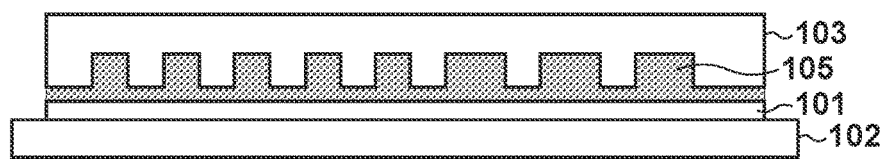

In step S105, a pressing process is performed. More specifically, first, as shown in FIG. 4B, the mold 103 is brought closer to the substrate 101 onto which the imprint material 105 has been supplied. Then, as shown in FIG. 4C, the mold 103 and the imprint material 105 on the substrate are brought into contact with each other while the mold 103 and the substrate 101 are aligned. This state is maintained until the pattern of the mold 103 is filled with the imprint material 105. At an initial stage at which the mold 103 and the imprint material 105 on the substrate are brought into contact with each other, the filling of the pattern of the mold 103 with the imprint material 105 is insufficient, and filling defects have thus occurred in part (corners) of the pattern. However, with the lapse of time in the state in which the mold 103 is in contact with the imprint material 105 on the substrate, every corner of the pattern of the mold 103 is filled with the imprint material 105, thereby decreasing the filling defects.

Figure 4D:
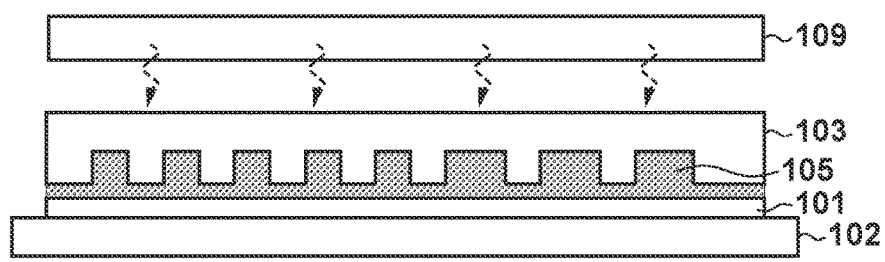

In step S106, a curing process is performed. More specifically, after the pattern of the mold 103 is satisfactorily filled with the imprint material 105, the irradiation unit 109 irradiates the imprint material 105 with ultraviolet light from the back surface of the mold 103 for a predetermined time, as shown in FIG. 4D, thereby curing the imprint material 105 on the substrate.

Figure 4E:
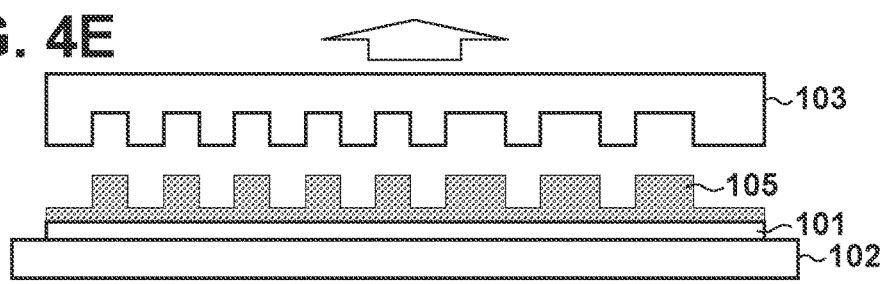

In step S107, a release process is performed. More specifically, as shown in FIG. 4E, the mold 103 is separated from the cured imprint material 105 on the substrate. As a result, a pattern of the imprint material 105 corresponding to the pattern of the mold 103 is formed on the substrate.

Figure 5A:
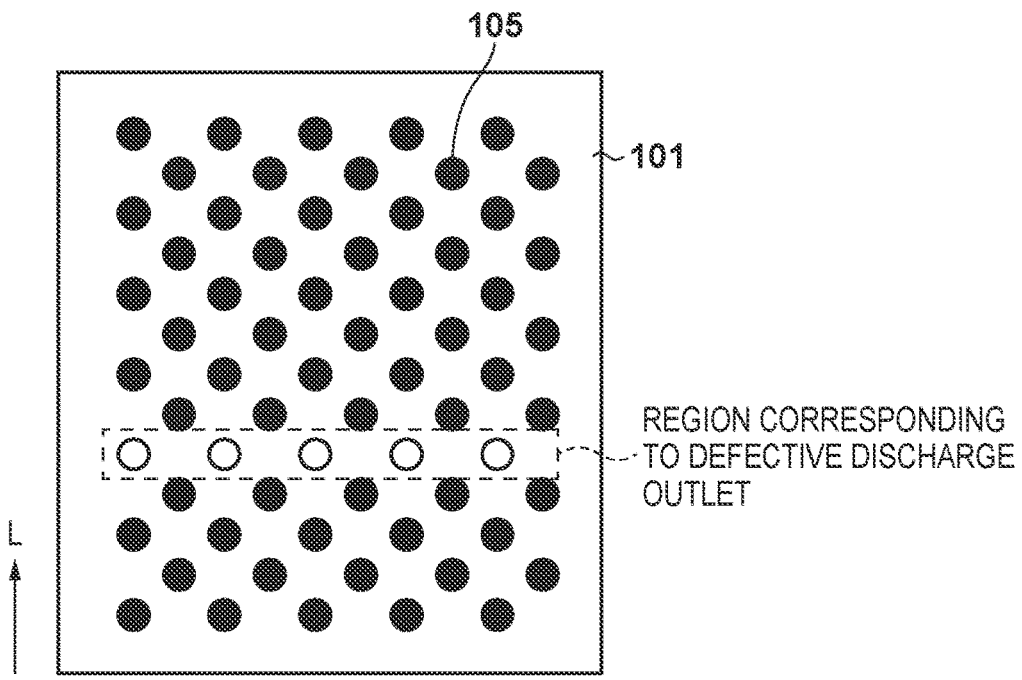
FIGS. 5A and 5B are views each showing the state of an imprint material on the substrate observed by the observation unit of the imprint apparatus shown in FIG. 1.
Figure 5B:
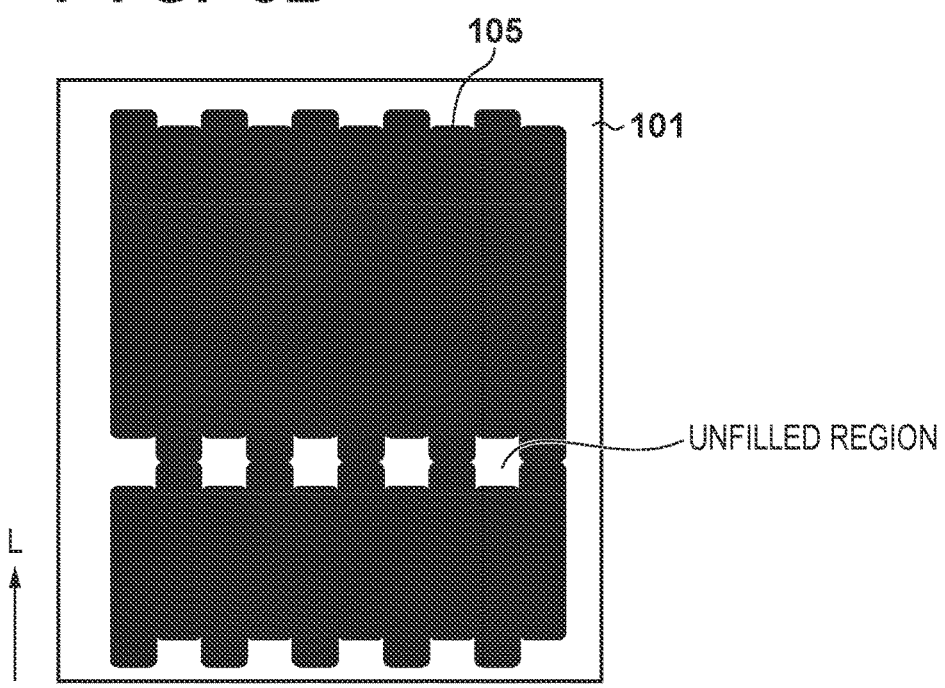

In step S108, it is determined whether there is a defective discharge outlet (abnormal discharge outlet) which cannot discharge droplets of the imprint material 105 among the plurality of discharge outlets of the discharge unit 107. Whether there is a defective discharge outlet can be determined using the observation unit 110 provided in the imprint apparatus 100. The observation unit 110 functions as a detection unit which detects the presence/absence of a defective discharge outlet among the plurality of discharge outlets of the discharge unit 107. FIGS. 5A and 5B each show the state of the imprint material 105 on the substrate observed by the observation unit 110. In FIGS. 5A and 5B, reference symbol L denotes a direction along a line pattern formed on the mold 103.

FIG. 5A shows the array of droplets of the imprint material 105 supplied from the discharge unit 107 onto the substrate in step S104. Droplets of the imprint material 105 are supplied in accordance with the map selected in step S102, and are supplied in a grid pattern in FIG. 5A. However, in a region, on the substrate, corresponding to a defective discharge outlet which cannot discharge droplets of the imprint material 105, no droplets of the imprint material 105 are supplied. Therefore, whether there is a defective discharge outlet can be determined based on the difference between the actual array of droplets of the imprint material 105 formed on the substrate and the supply positions on the substrate indicated by the map, that is, an ideal array of droplets of the imprint material 105.

FIG. 5B shows the state of the imprint material 105 after the pressing process is performed in step S105. The imprint material 105 on the substrate ideally spreads over the entire contact region of the mold 103 and the imprint material 105. If, however, there is a defective discharge outlet, a region unfilled with the imprint material 105 is generated between the mold 103 and the substrate 101, as shown in FIG. 5B. Therefore, whether there is a defective discharge outlet can be determined based on the presence/absence of a region unfilled with the imprint material 105.

As described above, whether there is a defective discharge outlet can be determined using an image observed by the observation unit 110 before bringing the mold 103 and the imprint material 105 into contact with each other or in the state in which the mold 103 is in contact with the imprint material 105. In other words, it is possible to detect the presence/absence of a defective discharge outlet between a process of supplying the imprint material 105 onto the substrate and a process of bringing the mold 103 and the imprint material 105 on the substrate into contact with each other.

In this embodiment, the observation unit 110 is used as a detection unit for detecting the presence/absence of a defective discharge outlet. The present invention, however, is not limited to this. For example, there may be provided a detection unit for optically or electrically detecting whether there is a defective discharge outlet while discharging droplets of the imprint material 105 from each of the plurality of discharge outlets of the discharge unit 107 in a pseudo manner.

Referring back to FIG. 2, if it is determined in step S108 that there is a defective discharge outlet, the process shifts to step S109. On the other hand, if it is determined in step S108 that there is no defective discharge outlet, the process shifts to step S111.

In step S109, the position of the defective discharge outlet of the plurality of discharge outlets of the discharge unit 107 is specified. Similarly to step S108, the position of the defective discharge outlet can be specified using the observation unit 110 provided in the imprint apparatus 100. For example, in FIG. 5A, the position of the defective discharge outlet can be specified based on the position of a region on the substrate, where no droplets of the imprint material 105 are supplied. In FIG. 5B, the position of the defective discharge outlet can be specified based on the position of the region unfilled with the imprint material 105, which has been generated between the mold 103 and the substrate 101.

In step S110, the map is updated so as to discharge, from a normal discharge outlet capable of discharging droplets among the plurality of discharge outlets, droplets corresponding to droplets of the imprint material 105 to be supplied onto the substrate from the defective discharge outlet of the plurality of discharge outlets of the discharge unit 107. In this embodiment, coordinate data about the supply positions of the droplets of the imprint material 105 to be supplied from the defective discharge outlet onto the substrate is changed to coordinate data in which the normal discharge outlet is located on the substrate. Note that after updating the map in step S110, the process shifts to step S103 to continue the imprint process.

Update of the map in step S110 will be described in detail. FIGS. 6A and 6B are views each showing the relationship between the plurality of discharge outlets of the discharge unit 107 and the map (the coordinate data about the supply positions of droplets of the imprint material 105). The discharge unit 107 includes, as the plurality of discharge outlets, 16 discharge outlets a1 to a16 arrayed in the Y-axis direction. The imprint material 105 is supplied onto the substrate by scanning the substrate 101 in a direction orthogonal to the array direction of the discharge outlets a1 to a16, that is, the X-axis direction (scanning direction) while discharging droplets of the imprint material 105 from the discharge outlets a1 to a16.

FIG. 6A shows a map (a map indicating the supply positions of droplets of the imprint material 105 to be supplied onto the substrate) MPA obtained by scanning the substrate 101 once while discharging droplets of the imprint material 105 from the plurality of discharge outlets a1 to a16 of the discharge unit 107. As shown in FIG. 6A, the map MPA includes coordinate data DA about the supply positions of droplets of the imprint material 105 to be supplied from the discharge outlets a1 to a16 onto the substrate, and coordinate data DB about positions at which no droplets of the imprint material 105 are supplied. As described above, the map MPA can also include discharge outlet number data for identifying discharge outlets to be used to discharge droplets of the imprint material 105 to the respective supply positions on the substrate.

With reference to FIG. 6A, among the plurality of discharge outlets a1 to a16 of the discharge unit 107, the discharge outlet a6 is a defective discharge outlet. There are two supply positions of droplets of the imprint material 105 to be supplied from the discharge outlet a6 onto the substrate, and the map MPA includes coordinate data DC about the supply positions. Since the discharge outlet a6 is a defective discharge outlet, it is impossible to supply droplets of the imprint material 105 to the supply positions on the substrate assigned to the discharge outlet a6. Therefore, an abnormality of the residual layer thickness or a defect of the pattern of the imprint material 105 formed on the substrate may occur due to a lack of filling with the imprint material 105 at or near the supply positions of droplets of the imprint material 105 to be supplied from the discharge outlet a6 onto the substrate. Filling of the pattern of the mold 103 with the imprint material 105 is accelerated by sufficiently prolonging a time for maintaining the state in which the mold 103 is in contact with the imprint material 105 on the substrate, thereby making it possible to reduce the lack of filling with the imprint material 105. In this case, however, since the time required to perform an imprint processing, that is, the time required to form a pattern of the imprint material 105 on the substrate significantly increases, the productivity of the imprint apparatus 100 lowers.

To solve this problem, in this embodiment, as described above, the map MPA is updated so as to discharge, from, for example, the discharge outlet a5 adjacent to the discharge outlet a6, droplets corresponding to droplets of the imprint material 105 to be supplied from the discharge outlet a6 onto the substrate. More specifically, as shown in FIG. 6B, the coordinate data DC about the supply positions on the substrate assigned to the discharge outlet a6 is changed to coordinate data DD in which the discharge outlet a5 adjacent to the discharge outlet a6 on the substrate is located. At this time, the coordinate data DC is changed to the coordinate data DD (the map MPA is updated) on condition that the number of times the substrate 101 is scanned with respect to the discharge unit 107, which is necessary to supply the imprint material 105 onto the substrate, is prevented from increasing.

As described above, in this embodiment, it is possible to use the discharge unit 107 in which the defective discharge outlet (discharge outlet a6) remains, by updating the map MPA shown in FIG. 6A to a map MPB shown in FIG. 6B. Furthermore, the map MPB makes it possible to supply the imprint material 105 onto the substrate while maintaining the number of droplets of the imprint material 105 defined in the map MPA. At this time, it is possible to suppress, to small amounts, variation amounts from the supply positions on the substrate assigned to the defective discharge outlet by discharging droplets of the imprint material 105 from the normal discharge outlet adjacent to the defective discharge outlet among the plurality of discharge outlets a1 to a16 of the discharge unit 107. Thus, it is possible to minimize the influence on the filling property of the pattern of the mold 103 with the imprint material 105 and the residual layer thickness of the pattern of the imprint material 105 formed on the substrate.

On the other hand, a lack of filling with the imprint material 105 or an abnormality of the residual layer thickness of the imprint material 105 formed on the substrate may occur by updating the map due to the defective discharge outlet. In this case, the filling time, that is, the time for maintaining the state in which the mold 103 is in contact with the imprint material 105 on the substrate is prolonged, as compared with the condition before the map is updated, thereby accelerating filling of the pattern of the mold 103 with the imprint material 105. At this time, it is necessary to obtain in advance the relationship between the variation amounts from the supply positions on the substrate assigned to the defective discharge outlet and the time for maintaining the state in which the mold 103 is in contact with the imprint material 105 on the substrate. In addition, the state in which the mold 103 is in contact with the imprint material 105 on the substrate may be maintained until the distribution of the residual layer thickness of the pattern of the imprint material 105 formed on the substrate falls within an allowable range.

As described above, in accordance with the map updated due to the defective discharge outlet, it is possible to control the time for maintaining the state in which the mold 103 is in contact with the imprint material 105 on the substrate. In this case as well, it is possible to minimize the prolonged time for maintaining the state in which the mold 103 is in contact with the imprint material 105 on the substrate. This is because droplets of the imprint material 105 are supplied near the supply positions on the substrate assigned to the defective discharge outlet while maintaining the number of droplets of the imprint material 105 to be supplied onto the substrate, as described above.

Referring back to FIG. 2, it is determined in step S111 whether the imprint process has been performed for all the shot regions of the substrate 101. If the imprint process has not been performed for all the shot regions of the substrate 101, the process shifts to step S103 to designate, as a target shot region, a shot region not having undergone the imprint process. By repeating the processes in steps S103 to S111, a pattern of the imprint material 105 is formed in all the shot regions of the substrate 101. On the other hand, if the imprint process has been performed for all the shot regions of the substrate 101, the process shifts to step S112.

In step S112, the substrate 101 having undergone the imprint process in all the shot regions is unloaded from the imprint apparatus 100. The substrate 101 unloaded from the imprint apparatus 100 is processed (for example, etched) on the lower layer side by using the pattern of the imprint material 105 as a mask. When manufacturing a semiconductor device, these processes are repeated for every layer of the process.

If the imprint process is performed for a plurality of substrates 101, a pattern of the imprint material 105 can be formed in each shot region of each of the plurality of substrates 101 by repeating the respective processes shown in FIG. 2. It is also possible to exchange the mold 103, as needed.

In the imprint apparatus 100 according to this embodiment, if some of the discharge outlets of the discharge unit 107 are defective discharge outlets, the map is updated so as to discharge droplets of the imprint material 105 from discharge outlets different from the defective discharge outlets. This can suppress an abnormality of the residual layer thickness or a defect of a pattern of the imprint material 105 formed on the substrate without increasing the number of times the substrate 101 is scanned with respect to the discharge unit 107 when supplying the imprint material 105 onto the substrate. Furthermore, even if the filling time is prolonged to keep an abnormality of the residual layer thickness or a defect of a pattern of the imprint material 105 formed on the substrate at a predetermined level or higher, it is possible to minimize the prolonged filling time, as described above. Thus, this is also advantageous in productivity.

<Second Embodiment>

Update (step S110) of a map according to the second embodiment will be described in detail. FIGS. 7A and 7B are views each showing the relationship between the plurality of discharge outlets of a discharge unit 107 and a map (coordinate data about the supply positions of droplets of an imprint material 105). The discharge unit 107 includes, as the plurality of discharge outlets, 16 discharge outlets a1 to a16 arrayed in the Y-axis direction. In this embodiment, the imprint material 105 is supplied onto a substrate as follows. First, a substrate 101 is scanned in the X-axis (+) direction (forward path) while discharging droplets of the imprint material 105 from the discharge outlets a1 to a16. Next, discharge of droplets of the imprint material 105 from the discharge outlets a1 to a16 is stopped, and the substrate 101 is shifted in the Y-axis direction by a distance corresponding to half the interval between the discharge outlets a1 to a16. Then, the substrate 101 is scanned in the X-axis (−) direction (backward path) while discharging droplets of the imprint material 105 from the discharge outlets a1 to a16. This can set the density of droplets of the imprint material 105 supplied onto the substrate to be twice higher than that of the interval between the discharge outlets a1 to a16 in the array direction of the discharge outlets a1 to a16 of the discharge unit 107. In other words, by scanning the substrate 101 in the X-axis direction twice, one discharge outlet of the discharge unit 107 is assigned with supply positions on two rows in a coordinate system (a map MPC) defined on the substrate in the array direction of the discharge outlets a1 to a16, that is, the Y-axis direction.

The intervals in the scanning direction between droplets of the imprint material 105 supplied onto the substrate can be adjusted by changing the discharge periods of droplets of the imprint material 105 discharged from the discharge outlets a1 to a16 of the discharge unit 107. The intervals in the scanning direction between droplets of the imprint material 105 supplied onto the substrate can also be adjusted by changing the scanning speed of the substrate 101 with respect to the discharge unit 107. Note that the intervals in the scanning direction between droplets of the imprint material 105 supplied onto the substrate may be adjusted by combining change of the discharge periods of droplets of the imprint material 105 and change of the scanning speed of the substrate 101 with respect to the discharge unit 107.

FIG. 7A shows the map (a map indicating the supply positions of droplets of the imprint material 105 to be supplied onto the substrate) MPC obtained by scanning the substrate 101 twice while discharging droplets of the imprint material 105 from the plurality of discharge outlets a1 to a16 of the discharge unit 107. With reference to FIG. 7A, among the plurality of discharge outlets a1 to a16 of the discharge unit 107, the discharge outlet a11 is a defective discharge outlet. Furthermore, the supply positions of the imprint material 105 to be supplied from the discharge outlet a11 onto the substrate exist in each of the two scans of the substrate 101, and the map MPC includes coordinate data DE and DF about the supply positions.

In this embodiment, the map MPC is updated so as to discharge, from other normal discharge outlets, for example, the discharge outlets a10 and a12 adjacent to the discharge outlet a11, droplets corresponding to droplets of the imprint material 105 to be supplied from the discharge outlet a11 onto the substrate. More specifically, as shown in FIG. 7B, the coordinate data DE about the supply positions on the substrate assigned to the discharge outlet a11 is changed to coordinate data DG in which the discharge outlet a10 adjacent to the discharge outlet a11 on the substrate is located. Similarly, the coordinate data DF about the supply positions on the substrate assigned to the discharge outlet a11 is changed to coordinate data DH in which the discharge outlet a12 adjacent to the discharge outlet a11 on the substrate is located. At this time, the coordinate data DE and DF are changed to the coordinate data DG and DH, respectively, without increasing the number of times the substrate 101 is scanned with respect to the discharge unit 107, which is necessary to supply the imprint material 105 onto the substrate.

As described above, in this embodiment, it is possible to use the discharge unit 107 in which the defective discharge outlet (discharge outlet a11) remains, by updating the map MPC shown in FIG. 7A to a map MPD shown in FIG. 7B. Furthermore, the map MPD makes it possible to supply the imprint material 105 onto the substrate while maintaining the number of droplets of the imprint material 105 defined in the map MPC. At this time, it is possible to suppress, to small amounts, variation amounts from the supply positions on the substrate assigned to the discharge outlet a11 by discharging droplets of the imprint material 105 from the discharge outlets a10 and a12 as normal discharge outlets adjacent to the discharge outlet a11 as a defective discharge outlet. Therefore, in this embodiment as well, it is possible to minimize the influence on the filling property of the pattern of a mold 103 with the imprint material 105 and the residual layer thickness of a pattern of the imprint material 105 formed on the substrate.

Furthermore, a lack of filling with the imprint material 105 or an abnormality of the residual layer thickness of the imprint material 105 formed on the substrate may occur by updating the map due to the defective discharge outlet. In this case, similarly to the first embodiment, the time for maintaining a state in which the mold 103 is in contact with the imprint material 105 on the substrate is controlled in accordance with the map updated due to the defective discharge outlet.

In an imprint apparatus 100 according to this embodiment, the density of droplets of the imprint material 105 supplied onto the substrate is set to be twice higher than that of the interval between the discharge outlets a1 to a16 of the discharge unit 107 by scanning the substrate 101 twice with respect to the discharge unit 107. In this imprint apparatus 100 as well, if some of the discharge outlets of the discharge unit 107 are defective discharge outlets, the map is updated not to use the defective discharge outlets. This can supply the imprint material 105 onto the substrate without increasing the number of times the substrate 101 is scanned with respect to the discharge unit 107 while maintaining the density of droplets of the imprint material 105 supplied onto the substrate when supplying the imprint material 105 onto the substrate. Consequently, the imprint apparatus 100 according to this embodiment is advantageous in productivity and suppression of an abnormality of the residual layer thickness or a defect of the pattern of the imprint material 105 formed on the substrate.

<Third Embodiment>

Update (step S110) of a map according to the third embodiment will be described in detail. FIGS. 8A and 8B are views each showing the relationship between the plurality of discharge outlets of a discharge unit 107 and a map (coordinate data about the supply positions of droplets of an imprint material 105). The arrangement of the discharge unit 107 and supply of the imprint material 105 onto a substrate are the same as in the second embodiment.

In this embodiment, assume that a concave-convex pattern of a predetermined period, that is, a plurality of line patterns (line-and-space pattern) are formed on a mold 103 in the Y-axis direction. When the mold 103 on which the line patterns have been formed and the imprint material 105 on the substrate are brought into contact with each other, the filling speed of the imprint material 105 generally tends to increase in a direction along the line patterns, and decrease in a direction orthogonal to the direction along the line patterns. In this case, the spread (filling shape) of the imprint material 105 has a shape close to an ellipse extending in the direction along the line patterns of the mold 103 in a planar view from the upper surface of the mold 103. In this embodiment, a map which prevents adjacent droplets of the imprint material 105 from being separated from each other by a predetermined distance or more in the direction orthogonal to the direction along the line pattern of the mold 103, in which the filling speed of the imprint material 105 is low, is used. Therefore, since the gap between the droplets of the imprint material 105 on the substrate does not become large with respect to the elliptic spread of the imprint material 105, it is possible to reduce unfilling of the pattern of the mold 103 with the imprint material 105, and shorten the filling time.

In this embodiment, supply positions on the substrate assigned to a defective discharge outlet are changed in one direction so the intervals between the adjacent droplets of the imprint material 105 on the substrate do not become large in the direction orthogonal to the direction along the line patterns of the mold 103.

With reference to FIG. 8A, among a plurality of discharge outlets a1 to a16 of the discharge unit 107, the discharge outlet a11 is a defective discharge outlet, and a map MPC includes coordinate data DE and DF about supply positions assigned to the defective discharge outlet. In this embodiment, the map MPC is updated so as to discharge, from the discharge outlet a12 adjacent to the discharge outlet a11 in one direction, droplets corresponding to droplets of the imprint material 105 to be supplied from the discharge outlet a11 onto the substrate. More specifically, as shown in FIG. 8B, the coordinate data DE and DF about the supply positions on the substrate assigned to the discharge outlet a11 are respectively changed to coordinate data DI and DJ in which the discharge outlet a12 adjacent to the discharge outlet a11 on the substrate is located.

In this embodiment, the map MPC shown in FIG. 8A is updated to a map MPE shown in FIG. 8B so the intervals between the supply positions on the substrate do not become large before and after update of the map in the direction (X-axis direction) orthogonal to the direction along the line patterns of the mold 103. Therefore, it is possible to suppress a decrease in filling performance of the mold 103, on which the line patterns have been formed, with the imprint material 105. Furthermore, in this embodiment, the map MPC is updated so that the intervals between the supply positions on the substrate become closer to regular (constant) intervals after update of the map MPC in the direction along the line patterns of the mold 103. This can further suppress a decrease in filling performance of the mold 103, on which the line patterns have been formed, with the imprint material 105.

In an imprint apparatus 100 according to this embodiment, it is possible to suppress a decrease in filling performance with the imprint material 105 by changing the map in consideration of the direction of the line patterns formed on the mold 103. Therefore, the imprint apparatus 100 according to this embodiment is advantageous in productivity and suppression of an abnormality of the residual layer thickness or a defect of a pattern of the imprint material 105 formed on the substrate.

<Fourth Embodiment>

Update (step S110) of a map according to the fourth embodiment will be described in detail. FIGS. 9A and 9B are views each showing the relationship between the plurality of discharge outlets of a discharge unit 107 and a map (coordinate data about the supply positions of droplets of an imprint material 105). The discharge unit 107 includes, as the plurality of discharge outlets, 18 discharge outlets a1 to a18 arrayed in the Y-axis direction, and has a discharge region larger than a map MPC. Note that supply of the imprint material 105 onto a substrate is the same as in the second embodiment.

In this embodiment, since the discharge unit 107 has the discharge region larger than the map MPC, if there is a defective discharge outlet, it is possible to update the map MPC so that the number of supply positions on the substrate assigned to the defective discharge outlet decreases. In other words, the relative position between a substrate 101 and the discharge outlets a1 to a18 of the discharge unit 107 is changed by changing discharge outlet number data, for identifying discharge outlets used to discharge droplets of the imprint material 105, which are included in the map MPC.

With reference to FIG. 9A, there are five supply positions on the substrate assigned to the discharge outlet a11 as a defective discharge outlet, and the map MPC includes coordinate data DE and DF about the supply positions. On the other hand, there is one supply position on the substrate assigned to a normal discharge outlet adjacent to the defective discharge outlet, for example, the discharge outlet a10, and the map MPC includes coordinate data DK about the supply position. If the discharge outlet number data are changed to assign the discharge outlet a10 as a normal discharge outlet to the coordinate data DE and DF, one supply position on the substrate is assigned to the discharge outlet a11 as a defective discharge outlet. This reduces the difference (change amount) between the array of droplets of the imprint material 105 to be supplied onto the substrate and the array of droplets of the imprint material 105 actually supplied onto the substrate. Therefore, in this embodiment as well, it is possible to minimize the influence on the filling property of the pattern of the mold 103 with the imprint material 105 and the residual layer thickness of a pattern of the imprint material 105 formed on the substrate.

Furthermore, in this embodiment, as shown in FIG. 9B, the coordinate data about the supply position on the substrate assigned to the discharge outlet a11 as a defective discharge outlet may be changed to the coordinate data DK in which the discharge outlet a12 adjacent to the discharge outlet a11 on the substrate is located. FIG. 9B shows a map MPF obtained by changing discharge outlet number data so that the position of the substrate 101 moves in the Y-axis (+) direction with respect to the discharge outlets a1 to a18 and changing the coordinate data about the supply position on the substrate assigned to the discharge outlet a11. If the map includes the discharge outlet number data, the map can be readily updated with reference to the discharge outlet number data corresponding to the defective discharge outlet so that the number of supply positions on the substrate assigned to the defective discharge outlet decreases.

This embodiment has explained the example in which the map is updated so that the number of supply positions on the substrate assigned to a defective discharge outlet decreases after the map is changed. Note that in some cases, the map can be updated so that the number of supply positions on the substrate assigned to the defective discharge outlet becomes zero after the map is changed. In this case, it becomes possible to supply droplets of the imprint material 105 to the supply positions of droplets of the imprint material 105 to be supplied onto the substrate by only changing the discharge outlet number data included in the map.

As described above, in this embodiment, the relative position between the discharge unit 107 and the substrate 101 is controlled so as to supply, to the supply positions of droplets of the imprint material 105 to be supplied from the defective discharge outlet onto the substrate, droplets of the imprint material 105 discharged from the normal discharge outlet. Therefore, the imprint apparatus 100 according to this embodiment is advantageous in productivity and suppression of an abnormality of the residual layer thickness or a defect of a pattern of the imprint material 105 formed on the substrate.

<Fifth Embodiment>

Figure 10A:
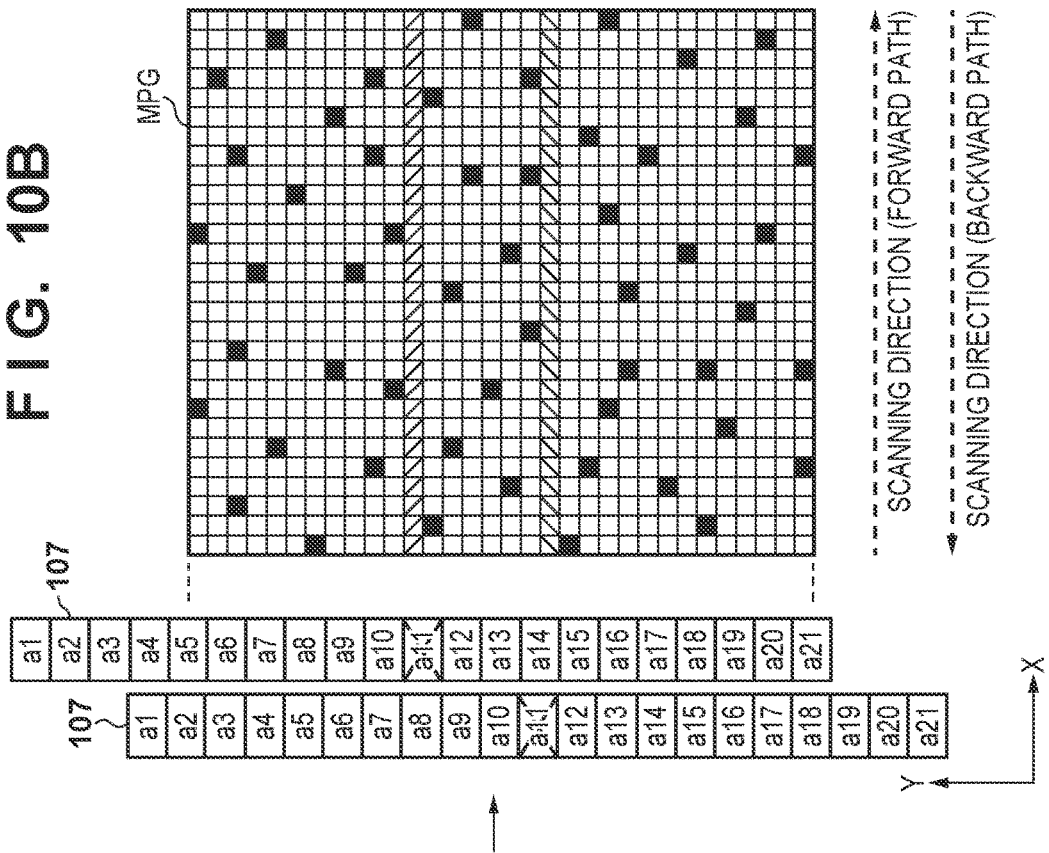
FIGS. 10A and 10B are views each showing the relationship between a map and the plurality of discharge outlets of the discharge unit of the imprint apparatus shown in FIG. 1.
Figure 10B:
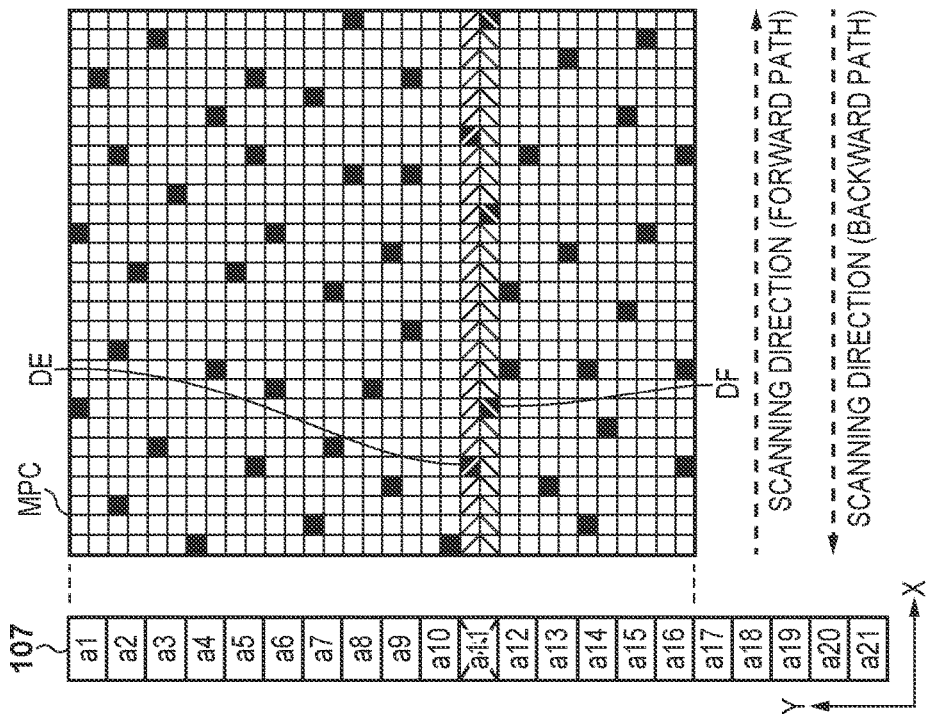

Update (step S110) of a map according to the fifth embodiment will be described in detail. FIGS. 10A and 10B are views each showing the relationship between the plurality of discharge outlets of a discharge unit 107 and a map (coordinate data about the supply positions of droplets of an imprint material 105). The discharge unit 107 includes, as the plurality of discharge outlets, 21 discharge outlets a1 to a21 arrayed in the Y-axis direction, and has a discharge region larger than a map MPC. In this embodiment, the imprint material 105 is supplied onto a substrate as follows. First, a substrate 101 is scanned in the X-axis (+) direction (forward path) while discharging droplets of the imprint material 105 from discharge outlets corresponding to the map MPC (the region of it) among the discharge outlets a1 to a21. Next, discharge of droplets of the imprint material 105 is stopped, and the substrate 101 is shifted in the Y-axis direction by a distance corresponding to half the interval between the discharge outlets a1 to a21 or a distance obtained by adding, to the distance, a distance corresponding to an integer multiple of the interval between the discharge outlets a1 to a21. Then, the substrate 101 is scanned in the X-axis (−) direction (backward path) while discharging droplets of the imprint material 105 from the discharge outlets corresponding to the map MPC among the discharge outlets a1 to a21. This can set the density of droplets of the imprint material 105 supplied onto the substrate to be twice higher than that of the interval between the discharge outlets a1 to a21 in the array direction of the discharge outlets a1 to a21 of the discharge unit 107.

In this embodiment, the discharge unit 107 has the discharge region larger than the map MPC. Therefore, similarly to the fourth embodiment, if there is a defective discharge outlet, it is possible to update the map MPC so that the number of supply positions on the substrate assigned to the defective discharge outlet decreases. Furthermore, in this embodiment, as compared with the fourth embodiment, it is possible to use the movability equal to or larger than the interval between the discharge outlets a1 to a21 in the forward and backward paths when scanning the substrate 101. Consequently, it is possible to assign supply positions on the substrate to each of the discharge outlets a1 to a21 in each row of a coordinate system (map MPC) defined on the substrate in the Y-axis direction.

With reference to FIG. 10A, there are five supply positions on the substrate assigned to the discharge outlet a11 as a defective discharge outlet, and the map MPC includes coordinate data DE and DF about the supply positions. On the other hand, in the forward path when scanning the substrate 101, for example, there is no supply position on the substrate assigned to the discharge outlet a10 as a normal discharge outlet. Similarly, in the backward path when scanning the substrate 101, there is no supply position on the substrate assigned to the discharge outlet a16 as a normal discharge outlet.

In the forward path when scanning the substrate 101, as shown in FIG. 10B, discharge outlet number data are changed so as to assign the discharge outlet a12 as a normal discharge outlet to the coordinate data DE. In the backward path when scanning the substrate 101, as shown in FIG. 10B, the discharge outlet number data are changed so as to assign the discharge outlet a16 as a normal discharge outlet to the coordinate data DF. As described above, in this embodiment, the map MPC shown in FIG. 10A is updated to a map MPG shown inn FIG. 10B. This eliminates the supply positions on the substrate assigned to the discharge outlet a11 as a defective discharge outlet in the forward and backward paths when scanning the substrate 101. Therefore, it is possible to supply droplets of the imprint material 105 to the supply positions of droplets of the imprint material 105 to be supplied onto the substrate without changing the coordinate data about the supply positions on the substrate.

This embodiment has explained the example in which the map is updated so that the number of supply positions on the substrate assigned to the defective discharge outlet becomes zero after the map is changed. The present invention, however, is not limited to this. For example, the number of supply positions on the substrate assigned to the defective discharge outlet cannot be set to zero after the map is changed. In this case, the map is updated to decrease the number of supply positions on the substrate assigned to the defective discharge outlet after the map is changed. In this case as well, it is possible to suppress the influence on the filling property of the pattern of a mold 103 with the imprint material 105 and the residual layer thickness of a pattern of the imprint material 105 formed on the substrate.

As described above, in this embodiment, the relative position between the discharge unit 107 and the substrate 101 is controlled so as to supply, to the supply positions of droplets of the imprint material 105 to be supplied from the defective discharge outlet onto the substrate, droplets of the imprint material 105 discharged from the normal discharge outlet. Therefore, an imprint apparatus 100 according to this embodiment is advantageous in productivity and suppression of an abnormality of the residual layer thickness or a defect of the pattern of the imprint material 105 formed on the substrate.

<Sixth Embodiment>

A method of manufacturing a device (a semiconductor device, magnetic storage medium, liquid crystal display element, or the like) as an article will be described. This manufacturing method includes a step of forming a pattern on a substrate (a wafer, glass plate, film-like substrate, or the like) using an imprint apparatus 100. The manufacturing method also includes a step of processing the substrate on which the pattern has been formed. This processing step can include a step of removing the residual film of the pattern.

In addition, the method can include other known steps such as a step of etching the substrate using the pattern as a mask. The method of manufacturing an article according to this embodiment is advantageous over the related art in terms of at least one of the performance, quality, productivity, and production cost of articles.

<Seventh Embodiment>

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

In this embodiment (especially, the fourth and fifth embodiments), a stage 102 is used to change the relative position between a substrate 101 and the plurality of discharge outlets of a discharge unit 107. If, however, an imprint apparatus 100 includes a driving unit for moving the discharge unit 107 (the plurality of discharge outlets of it), it is possible to obtain the same effect by controlling at least one of the driving unit and the stage 102.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-025201 filed on Feb. 12, 2016, which is hereby incorporated by reference herein in its entirety.

What is claimed is:

1. An imprint apparatus which performs molding of an imprint material on a substrate to form a pattern on the substrate, the apparatus comprising:
   a supply device including discharge ports which discharge the imprint material, and configured to supply the imprint material onto the substrate via the discharge ports based on a map; and
   a controller configured to cause, if there is a defective discharge port of the discharge ports, the supply device to discharge the imprint material from another discharge port, different from the defective discharge port, of the discharge ports, based on an updated map, wherein a mold for the molding includes a line pattern, and the controller is configured to control the supply device, based on the updated map, to prevent droplets of the imprint material discharged from the discharge ports from being separated from each other by a predetermined distance or more in a direction orthogonal to the direction along the line pattern of the mold, such that an interval between supply positions of the imprint material do not become larger in a direction orthogonal to a direction along the line pattern than that before change from the defective discharge port to the other discharge port.

2. The apparatus according to claim 1, wherein the controller is configured to cause the supply device to discharge the imprint material from the other discharge port that is adjacent to the defective discharge port.

3. An imprint apparatus which performs molding of an imprint material on a substrate to form a pattern on the substrate, the apparatus comprising:

a supply device including discharge ports which discharge the imprint material, and configured to supply the imprint material onto the substrate via the discharge ports; and a controller configured to cause, if there is a defective discharge port of the discharge ports, the supply device to discharge the imprint material from another discharge port, different from the defective discharge port, of the discharge ports, wherein a mold for the molding includes a line pattern, and the controller is configured to control the supply device such that intervals each of which between adjacent supply positions of the imprint material become closer to a constant interval in a direction along the line pattern than those before change from the defective discharge port to the other discharge port.

4. The apparatus according to claim 1, wherein the controller is configured to cause a supply position of the imprint material on the substrate supplied by the other discharge port to be different from a supply position on the substrate of the imprint material which should have been supplied by the defective discharge port, based on a position of the other discharge port.

5. The apparatus according to claim 1, wherein the controller is configured to control the supply device such that number of times of scanning the substrate relative to the supply device does not increase due to change from the defective discharge port to the other discharge port.

6. An imprint apparatus which performs molding of an imprint material on a substrate to form a pattern on the substrate, the apparatus comprising:

a supply device including discharge ports which discharge the imprint material, and configured to supply the imprint material onto the substrate via the discharge ports based on a map; and a controller configured to cause, if there is a defective discharge port of the discharge ports, the supply device to discharge the imprint material from another discharge outlet, different from the defective discharge port, of the discharge ports, based on an updated map, wherein the controller is configured to change a time for filling a mold for the molding with the imprint material based on change from the defective discharge port to the other discharge port based on the updated map, to prevent droplets of the imprint material discharged from the discharge ports from being separated from each other by a predetermined distance or more.

7. An imprint apparatus which performs molding of an imprint material on a substrate to form a pattern on the substrate, the apparatus comprising:

a supply device including discharge ports which discharge the imprint material, and configured to supply the imprint material onto the substrate via the discharge ports based on a map; and a controller configured to cause, if there is a defective discharge port of the discharge ports, the supply device to discharge the imprint material from another discharge port, different from the defective discharge port, of the discharge ports based on an updated map, wherein the controller is configured to control the supply device and a relative position between the supply device and the substrate, based on the updated map, to prevent droplets of the imprint material discharged from the discharge ports from being separated from each other by a predetermined distance or more, wherein the imprint material is supplied from the other discharge port to a supply position on the substrate of the imprint material which should have been supplied from the defective discharge port.

8. The apparatus according to claim 7, further comprising:

at least one of a stage configured to hold the substrate and be movable, and a driving device configured to move the discharge ports, wherein the controller is configured to control the at least one to control the relative position.

9. The apparatus according to claim 8, wherein the controller is configured to control the relative position by one of a distance corresponding to half an interval between the discharge ports and a distance corresponding to a value obtained by adding an integer multiple of the interval to the interval.

10. The apparatus according to claim 1, further comprising:

a detection device configured to perform detection of the defective discharge port.

11. The apparatus according to claim 10, wherein the detection device is configured to perform the detection between a process of supplying the imprint material onto the substrate and a process of bringing the mold and the imprint material into contact with each other.

12. The apparatus according to claim 10, wherein the detection device is configured to perform the detection in a state where the mold is in contact with the imprint material.

13. The apparatus according to claim 1, wherein the controller is configured to control the supply device via a map indicating positions, at which the imprint material is to be supplied, on the substrate.

14. A method of manufacturing an article, the method comprising steps of:

forming a pattern on a substrate using an imprint apparatus defined in claim 1; and processing the substrate, on which the pattern has been formed, to manufacture the article.

15. A method of manufacturing an article, the method comprising steps of:

forming a pattern on a substrate using an imprint apparatus defined in claim 3; and processing the substrate, on which the pattern has been formed, to manufacture the article.

16. A method of manufacturing an article, the method comprising steps of:

forming a pattern on a substrate using an imprint apparatus defined in claim 6; and processing the substrate, on which the pattern has been formed, to manufacture the article.

17. A method of manufacturing an article, the method comprising steps of:

forming a pattern on a substrate using an imprint apparatus defined in claim 7; and processing the substrate, on which the pattern has been formed, to manufacture the article.

\* \* \* \* \*